(12) United States Patent
Choi et al.

(10) Patent No.: US 7,583,509 B2
(45) Date of Patent: Sep. 1, 2009

(54) MEMORY MODULE AND MEMORY SYSTEM HAVING THE SAME

(75) Inventors: In-su Choi, Seoul (KR); Joon-hee Lee, Gyeonggi-do (KR); Hee-joo Choi, Gyeonggi-do (KR); Il-guy Jung, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 502 days.

(21) Appl. No.: 11/325,083

(22) Filed: Jan. 4, 2006

(65) Prior Publication Data

US 2006/0176723 A1    Aug. 10, 2006

(30) Foreign Application Priority Data

Jan. 6, 2005    (KR)    .................... 10-2005-0001122

(51) Int. Cl.
*H05K 1/00*    (2006.01)
(52) U.S. Cl. .................. 361/749; 361/728; 361/748
(58) Field of Classification Search .............. 361/728, 361/748, 749; 365/51
See application file for complete search history.

(56) References Cited

U.S. PATENT DOCUMENTS

| | | | |
|---|---|---|---|
| 5,949,657 A * | 9/1999 | Karabatsos | ................. 361/803 |
| 6,438,012 B1 | 8/2002 | Osaka et al. | |
| 6,542,373 B1 | 4/2003 | Oba | |
| 6,590,781 B2 | 7/2003 | Kollipara et al. | |
| 6,594,167 B1 | 7/2003 | Yamasaki et al. | |
| 6,614,664 B2 * | 9/2003 | Lee | ............. 361/784 |
| 6,654,270 B2 | 11/2003 | Osaka et al. | |
| 6,772,262 B1 | 8/2004 | Park et al. | |
| 7,072,201 B2 * | 7/2006 | So et al. | ................. 365/63 |
| 2002/0048157 A1 * | 4/2002 | Lee | ............. 361/784 |
| 2003/0035312 A1 | 2/2003 | Halbert et al. | |
| 2004/0260859 A1 | 12/2004 | Park et al. | |

FOREIGN PATENT DOCUMENTS

| | | |
|---|---|---|
| EP | 0 849 738 A2 | 6/1998 |
| EP | 0849738 A2 | 6/1998 |
| JP | 11-330394 | 11/1999 |

(Continued)

OTHER PUBLICATIONS

Office Action issued by the Korean Intellectual Property Office on Jul. 31, 2006, corresponding to Korean Patent Application No. 10-2005-0001122.

(Continued)

*Primary Examiner*—Tuan T Dinh
*Assistant Examiner*—Abiy Getachew
(74) *Attorney, Agent, or Firm*—Myers Bigel Sibley & Sajovec, P.A.

(57) ABSTRACT

A memory module and a memory system are provided. The memory module includes a first circuit board on which at least one memory chip is mounted, a second circuit board on which at least one memory chip is mounted, and a flexible coupler electrically connecting the first circuit board to the second circuit board. The memory module is bendable and is configured to extend around a memory controller. The memory chips are electrically coupled with the memory controller via a respective plurality of signal lines. The bendable memory module is configured to be bent around the memory controller such that respective lengths of the signal lines are equal.

9 Claims, 4 Drawing Sheets

FOREIGN PATENT DOCUMENTS

| | | |
|---|---|---|
| JP | 2003-271538 | 9/2003 |
| KR | 2002-0031806 | 5/2002 |
| KR | 2004-0079780 A | 9/2004 |

OTHER PUBLICATIONS

Office Action issued by the German Patent and Trademark Office on Apr. 17, 2007, corresponding to German Patent Application No. 10 2006 000 715.8-55.

Notice of the Office Action for Korean Patent Application No. 2005-0001122 issued by the Taiwan Patent Office on May 7, 2008.

Office Action of the IPO for the corresponding Taiwanese Patent Application No. 095100680 issued Feb. 6, 2009.

* cited by examiner

MEMORY MODULE AND MEMORY SYSTEM HAVING THE SAME

RELATED APPLICATION

The present application claims priority from Korean Patent Application No. 10-2005-0001122, filed on Jan. 6, 2005, in the Korean Intellectual Property Office, the disclosure of which is incorporated herein in its entirety by reference.

FIELD OF THE INVENTION

The present invention relates to memory modules and systems, and more particularly, to flexible memory modules and a memory system with the same.

BACKGROUND OF THE INVENTION

FIG. 1 is a schematic illustration of a conventional memory system 100 with memory modules MM1 and MM2. The memory system 100 includes a board 110 on which a memory controller 120 and the memory modules MM1 and MM2 are installed. Each of the memory modules MM1 and MM2 includes a plurality of memory chips MC. The memory controller 120 transmits signals to the memory modules MM1 and MM2 via signal lines R1, R2, and R3 on the board 110. The signal lines R1, R2, and R3 may be metal lines or electrical lines through which electrical signals are transmitted.

In general, as the integration density of a circuit board increases, it is becoming difficult to equalize the lengths of signal lines connecting a memory controller to a memory module. If the lengths of the signal lines are different from one another, signals transmitted via the signal lines, for example R1,R2, and R3 in FIG. 1 have different signal characteristics.

In FIG. 1, the signal lines R1, R2, and R3 are bent to equalize the routing distances of a signal transmitted from the memory controller 120 to the memory module via the signal lines R1, R2, and R3. However, in this case, impedance mismatching or a transmission delay in the signal lines R1, R2, and R3 may occur.

FIG. 2 is a schematic illustration of a conventional memory system 200 with memory modules MM1 and MM2. The memory system 200 includes a circuit board 210 on which a memory controller 220 and the memory modules MM1 and MM2 are mounted. In FIG. 2, signal lines R1 and R2 are bent many times to equalize the routing distances of a signal transmitted from the memory controller 220 to the memory modules MM1 and MM2 via the signal lines R1 and R2. Thus, impedance mismatching or a transmission delay in the signal lines R1 and R2 may also occur.

FIG. 3 is a schematic illustration of a conventional memory module 300. The memory module 300 includes a plurality of memory chips MC, and a module tap MTP which is configured to receive a signal and transmit the signal to the memory chips MC.

The routing of signal lines R1 through R3 illustrated in FIGS. 1 and 2 can cause transmission delays and/or distortion of signal characteristics for signals transmitted via signal lines R1 through R3. Unfortunately, due to limited circuit board "real estate," there are limited numbers of ways to route signal lines between memory controllers and memory modules on a circuit board in order to overcome transmission delays and signal characteristics distortion.

SUMMARY OF THE INVENTION

According to one embodiment of the present invention, there is provided a memory module including a first circuit board on which at least one memory chip is mounted, a second circuit board on which at least one memory chip is mounted, and a flexible coupler electrically connecting the first circuit board to the second circuit board. Each of the first and second circuit boards includes a module tap configured to receive data.

Memory chips on each of the first and second circuit boards receive data directly via the module tap. The coupler transmits signals between at least one memory chip on the first circuit board and at least one memory chip on the second circuit board. The flexible coupler is configured to transmit various signals including, but not limited to, command signals, address signals, and clock signals.

The coupler may be a film cable and/or an electrical wire. The memory module may be a dual in-line memory module.

According to another aspect of the present invention, there is provided a memory module comprising a circuit board having an inflexible first section on which at least one memory chip is mounted, an inflexible second section on which at least one memory chip is mounted, and a flexible third section between the first and second.

Each of the first and second sections includes a module tap configured to receive data. The third section electrically connects the first section to the second section.

According to yet another embodiment of the present invention, there is provided a memory system comprising a memory controller, and a memory module which is to be bent to equalize and minimize the lengths of signal lines between each of a plurality of memory chips on the memory module and the memory controller.

The memory module comprises a first circuit board on which at least one memory chip is mounted, a second circuit board on which at least one memory chip is mounted, and a flexible coupler which electrically connects the first circuit board to the second circuit board. The first and second circuit boards are installed to extend around the memory controller such that the lengths of signal lines between the memory controller and each of the memory chips on the first and second circuit boards are equal to one another.

When the memory controller is square shaped, the first and second circuit boards are parallel with a first side and a second side of the memory controller, respectively.

According to another embodiment of the present invention, the memory system includes a second memory module having a third circuit board and a fourth circuit board which are electrically connected to each other via a flexible coupler., The third and fourth circuit boards are parallel with a third side and a fourth side of the memory controller, respectively. Each of the first and second circuit boards comprises a module tap that receives data, and memory chips on the first and second circuit boards receive data directly via the module tap.

The memory module comprises a circuit board having an inflexible first section on which at least one memory chip is mounted, an inflexible second section on which at least one memory chip is mounted, and a flexible third section which is installed between the first and second sections.

The first and second sections are installed to extend around the memory controller such that lengths of signal lines between the memory chips on the first and second sections and the memory controller are equal to one another. The flexible third section electrically connects the first section to the second section.

BRIEF DESCRIPTION OF THE DRAWINGS

The above and other aspects and advantages of the present invention will become more apparent by describing in detail exemplary embodiments thereof with reference to the attached drawings in which.

DETAILED DESCRIPTION OF THE INVENTION

Figure 1:
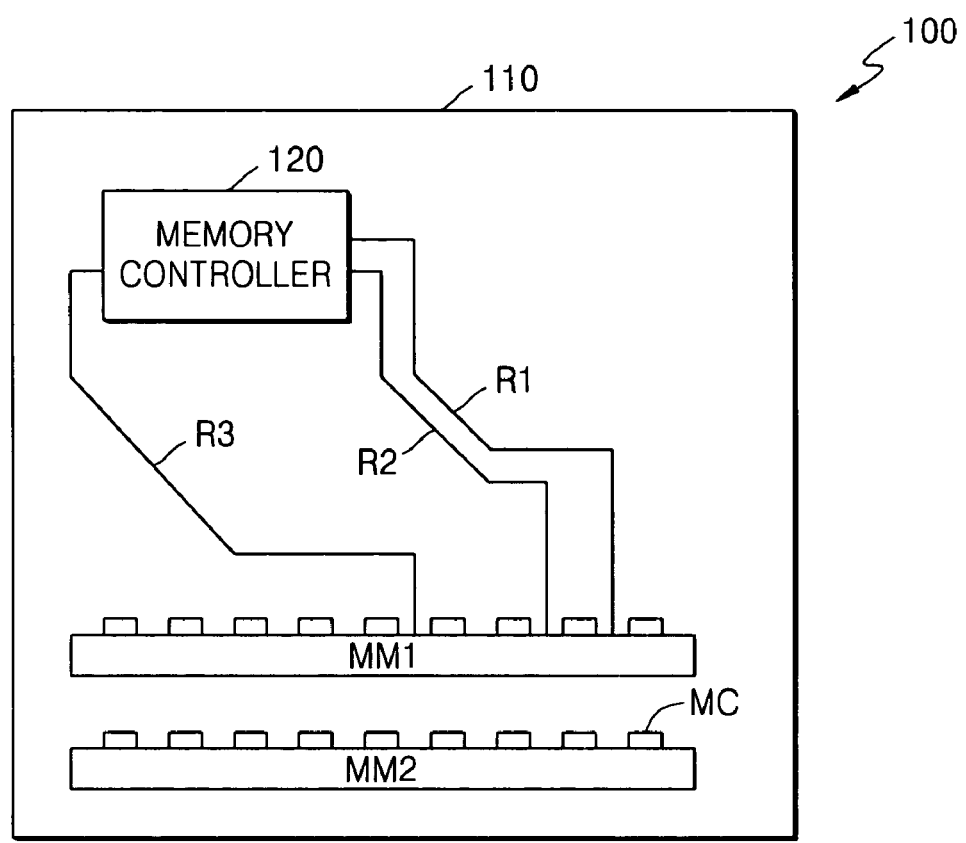
FIG. 1 is a schematic illustration of a conventional memory system with a memory module.
Figure 2:
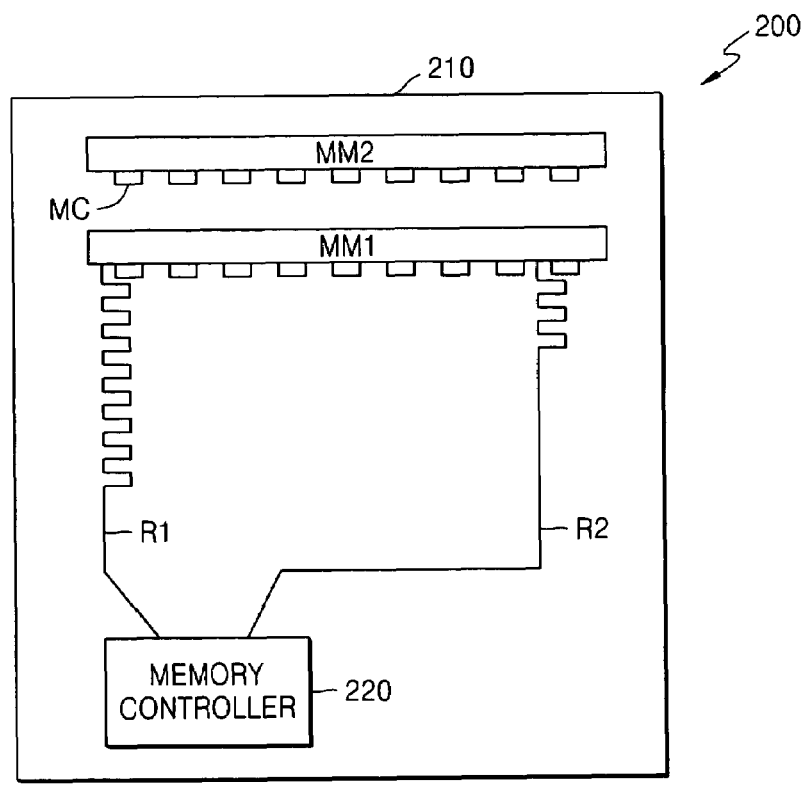
FIG. 2 is a schematic illustration of another conventional memory system with a memory module.

The present invention now is described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Like numbers refer to like elements throughout. In the figures, the thickness of certain lines, layers, components, elements or features may be exaggerated for clarity. Broken lines illustrate optional features or operations unless specified otherwise. All publications, patent applications, patents, and other references mentioned herein are incorporated herein by reference in their entireties.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

Spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. Thus, the exemplary term "under" can encompass both an orientation of "over" and "under". The device may be otherwise oriented (rotated 90 degrees or at other orientations) and the spatially relative descriptors used herein interpreted accordingly. Similarly, the terms "upwardly", "downwardly", "vertical", "horizontal" and the like are used herein for the purpose of explanation only unless specifically indicated otherwise.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a "first" element, component, region, layer or section discussed below could also be termed a "second" element, component, region, layer or section without departing from the teachings of the present invention. The sequence of operations (or steps) is not limited to the order presented in the claims or figures unless specifically indicated otherwise.

Figure 4:
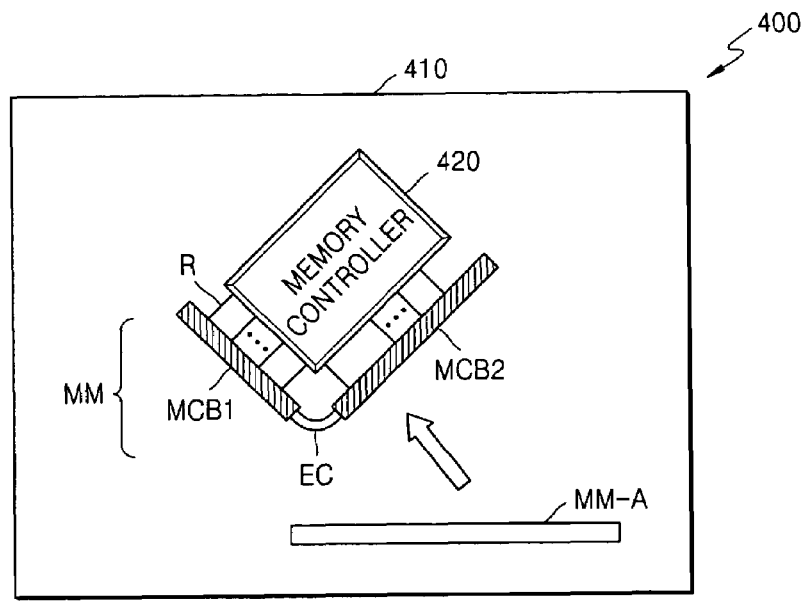
FIG. 4 is a schematic illustration of a memory system with a memory module according to an embodiment of the present invention.

Referring to FIG. 4, a memory system 400 according to embodiments of the present invention includes a memory controller 420 and memory module MM. The memory controller 420 and the memory module MM are mounted on a system board (i.e., a circuit board) 410.

The memory module MM is flexible in contrast with a conventional memory module illustrated as MM-A. According to embodiments of the present invention, the memory module MM can be bent and manipulated to extend around the memory controller 420, such that the length of the signal lines, for exchange of signals, between the memory controller 420 and a plurality of memory chips MC on the memory module MM are the same.

A memory module MM, according to embodiments of the present invention, can solve the problems of conventional memory modules which are typically hard, inflexible bar types and, thus, require signal lines connecting a memory controller to memory chips to be bent in order to equalize the routing distances of a signal transmitted from the memory controller to the memory chips on the memory module.

Bending of the memory module MM according to embodiments of the present invention to extend around the memory controller 420, as shown in FIG. 4, equalizes and minimizes the lengths of signal lines R from the memory controller 420 to the memory module MM. Data output from the memory controller 420 is input to the memory chips MC via a module tap MTP on the memory module MM.

Figure 3:
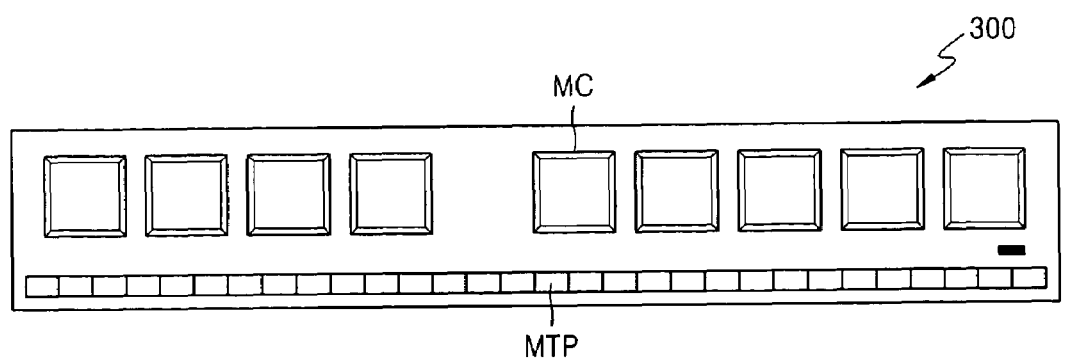
FIG. 3 is a schematic illustration of a conventional memory module.

The structure of the memory module MM will now be described in greater detail with reference to FIG. 5. The memory module MM includes first and second circuit boards MCB1 and MCB2, and a coupler EC. The constructions of the first and second circuit boards MCB1 and MCB2 can be similar to that of conventional memory modules (e.g., memory module 300 of FIG. 3) which are typically hard, inflexible bar types.

At least one memory chip MC is mounted on the first circuit board MCB1. A module tap MTP through which data is input to the first circuit board MCB1 is also mounted on the first circuit board MCB1.

Likewise, at least one memory chip MC is mounted on the second circuit board MCB2. A module tap MTP through which data is input to the second circuit board MCB2 is also mounted on the second circuit board MCB2.

The first circuit board MCB1 is electrically connected to the second circuit board MCB2 via flexible coupler EC. The coupler EC is a flexible unit, such as a film cable or an electrical wire, through which an electrical signal is transmitted and which can be bent.

The coupler EC allows transmission of an electrical signal between at least one memory chip MC on the first circuit board MCB1 and at least one memory chip MC on the second circuit board MCB2.

Since each of the first and second circuit boards MCB1 and MCB2 can transmit data from the memory controller 420 directly to their memory chips MC via the module tap MTP, a signal (e.g., a command signal, an address signal, or a clock signal) received via the coupler EC is sequentially transmitted to the module tap MTP, and the first and second circuit boards MCB1 and MCB2.

The memory module MM may be a DIMM (Dual In line Memory Module. Alternatively, the memory module MM may be an UDIMM (Un-buffered Dual In line Memory Module), an RDIMM (Registered Dual In line Memory Module), or a SODIMM (Small Outline Dual In line Memory Module).

In FIG. 4, the memory module MM is installed such that the respective lengths of signal lines R between the memory controller 420 and the first circuit board MCB1 and between the memory controller 420 and the second circuit board MCB2 are equal to each other and are minimized.

If the memory controller 420 is square shaped as illustrated in FIG. 4, the first and second circuit boards MCB1 and MCB2 of the memory module MM are bent using the coupler EC in parallel to first and second sides of the memory controller 420, respectively.

Therefore, the lengths of signal lines R from the memory controller 420 to the memory module MM can be equalized and minimized. Sockets (not shown) used to mount the memory module MM on the system board 410 are also installed in parallel to the first and second sides of the memory controller 420, respectively.

Figure 6:
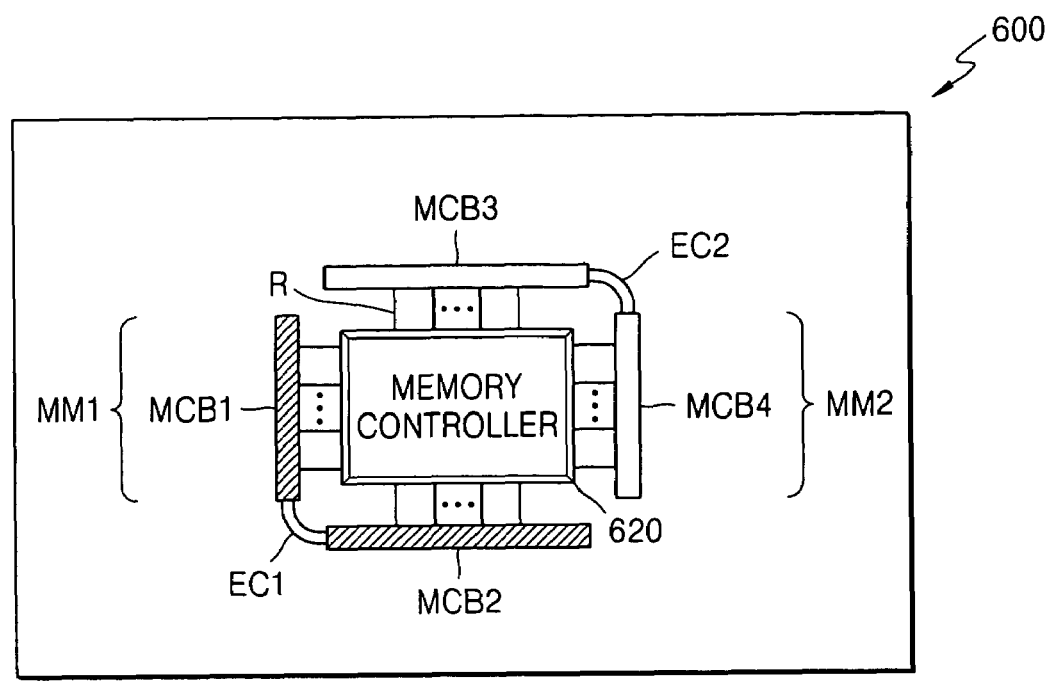
FIG. 6 is a schematic illustration of a memory system with a memory module according to another embodiment of the present invention.

FIG. 6 is a schematic illustration of a memory system 600 according to another embodiment of the present invention. The construction of the memory system 600 is similar to that of the memory system 400 of FIG. 4, except that third and fourth circuit boards MCB3 and MCB4 are installed in parallel with third and fourth sides of a memory controller 620. The illustrated memory system 600 further includes a memory module MM2 having the third and fourth circuit boards MCB3 and MCB4 which are connected via a coupler EC2.

In FIG. 6, a memory module MM1 having first and second circuit boards MCB1 and MCB2 and a coupler EC1 is similar to the memory module MM of FIG. 4, and the memory controller 620 is similar to the memory controller 420 of FIG. 4.

The illustrated memory system 600 of FIG. 6 has a dual channel system structure. The construction of the memory module MM2 is the same as that of the memory module MM of FIG. 5. The memory controller 620 can transmit the same or different data to the memory modules MM1 and MM2 via the signal lines R, which have the same lengths. The memory modules MM1 and MM2 can operate concurrently or individually.

The lengths of signal lines R between the memory controller 620 and the memory module MM1 are the same, and the lengths of signal lines R between the memory controller 620 and the memory module MM2 are the same.

However, the lengths of signal lines R between the memory controller 620 and the memory module MM1, and the lengths of signal lines R between the memory controller 620 and the memory module MM2 may be the same or may be different from each other. If necessary, the memory module MM2 may be installed such that it is further away from the memory controller 620 than the memory module MM1.

Figure 5:
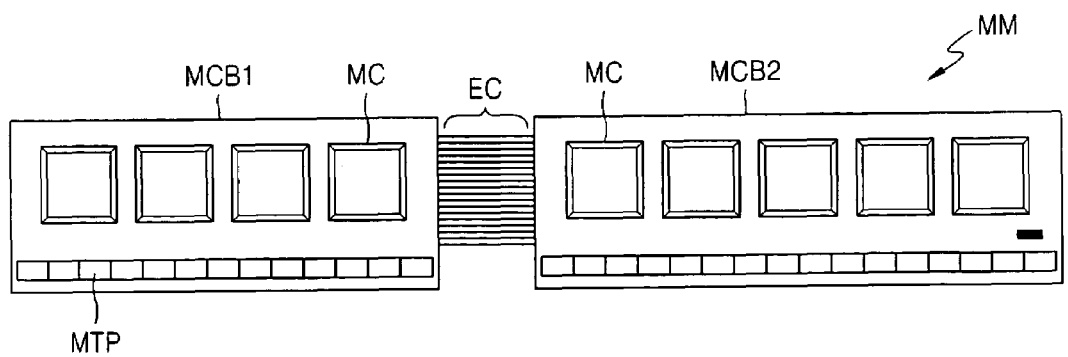
FIG. 5 is schematic illustration of a memory module according to an embodiment of the present invention.

A circuit board of the memory module MM illustrated in FIG. 5 may be divided into various numbers of sections. For instance, a first section may have an inflexible structure on which at least one memory chip is mounted, a second section may have an inflexible structure on which at least one memory chip is mounted, and a third section may have a flexible structure installed between the first and second sections.

Memory module circuit boards, according to embodiments of the present invention may have various configurations.

Memory modules and memory systems according to embodiments of the present invention, achieve the performance of conventional memory modules but with improved signal transmission characteristics.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. The invention is defined by the following claims, with equivalents of the claims to be included therein.

What is claimed is:

1. A memory system comprising:
   a memory controller; and
   a bendable memory module comprising a first circuit board on which at least one memory chip is mounted, a second circuit board on which at least one memory chip is mounted, and a flexible coupler which electrically connects the first circuit board to the second circuit board, wherein the plurality of memory chips mounted to the first and second circuit boards are electrically coupled with the memory controller via a respective plurality of signal lines, and wherein the bendable memory module is bent around the memory controller such that respective lengths of the signal lines are equal, wherein each of the first and second circuit boards comprises a module tap configured to receive data, and wherein memory chips on the first and second circuit boards receive data directly via the module tap.

2. The memory system of claim 1, wherein when the memory controller has a square shaped configuration, and wherein the first and second circuit boards are parallel with a first side and a second side of the memory controller, respectively.

3. The memory system of claim 2, further comprising a second memory module comprising a third circuit board and a fourth circuit board which are electrically connected to each other via a coupler, and wherein the third and fourth circuit boards are parallel with a third side and a fourth side of the memory controller, respectively.

4. The memory system of claim 1, wherein the coupler transmits signals between at least one memory chip on the first circuit board and at least one memory chip on the second circuit board.

5. The memory system of claim 1, wherein the coupler transmits signals selected from the group consisting of command signals, address signals, and clock signals.

6. The memory system of claim 1, wherein the coupler comprises film cable and electrical wire.

7. The memory system of claim 1, wherein the memory module is a dual in-line memory module.

8. The memory system of claim 1, wherein the memory module comprises a circuit board, wherein the circuit board includes:
- an inflexible first section on which at least one memory chip is mounted;
- an inflexible second section on which at least one memory chip is mounted; and
- a flexible third section between the first and second sections,
- wherein the first and second sections extend around the memory controller such that signal lines between the memory chips on the first and second sections and the memory controller have lengths equal to one another, and wherein each of the first and second sections includes a module tap configured to receive data.

9. The memory system of claim 7, wherein the flexible third section electrically connects the first section to the second section.

* * * * *